United States Patent
Benboudjema et al.

(10) Patent No.: US 11,909,366 B2
(45) Date of Patent: Feb. 20, 2024

(54) MULTISTAGE VARIABLE GAIN AMPLIFIER FOR SENSOR APPLICATION

(71) Applicant: GM Cruise Holdings LLC, San Francisco, CA (US)

(72) Inventors: Kamel Benboudjema, Pasadena, CA (US); Richard Kalantar Ohanian, Glendale, CA (US); Aram Garibyan, La Crescenta, CA (US); Abdelkrim El Amili, Arcadia, CA (US); Scott Singer, San Gabriel, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 0 days.

(21) Appl. No.: 17/555,460

(22) Filed: Dec. 19, 2021

(65) Prior Publication Data
US 2022/0116004 A1   Apr. 14, 2022

Related U.S. Application Data

(63) Continuation of application No. 16/858,559, filed on Apr. 24, 2020, now Pat. No. 11,271,536.

(51) Int. Cl.
*H03G 3/20* (2006.01)
*H03G 3/30* (2006.01)
(Continued)

(52) U.S. Cl.
CPC ............. *H03G 3/30* (2013.01); *G01S 7/4816* (2013.01); *G01S 17/931* (2020.01); *H03F 3/08* (2013.01);
(Continued)

(58) Field of Classification Search
CPC .. H03G 3/30; H03G 2201/103; H03G 1/0088; H03G 3/3036; H03G 3/20;
(Continued)

(56) References Cited

U.S. PATENT DOCUMENTS 5,923,215 A   7/1999   Hans
6,208,203 B1 *   3/2001   Jung ........................ H03F 3/72
                                                                330/51
(Continued)

OTHER PUBLICATIONS

"Notice of Allowance and Fees Due for U.S. Appl. No. 16/858,559", dated Dec. 17, 2021, 5 pages.
(Continued)

*Primary Examiner* — Khanh V Nguyen
(74) *Attorney, Agent, or Firm* — CALFEE, HALTER & GRISWOLD LLP

(57) ABSTRACT

Various technologies described herein pertain to variable gain amplification for a sensor application. A multistage variable gain amplifier system provides variable gain amplification of an input signal. The multistage variable gain amplifier system includes a plurality of amplification stages. The multistage variable gain amplifier system further includes a power detector configured to detect a power level of an input signal received by the multistage variable gain amplifier system. The multistage variable gain amplifier system also includes a controller configured to control the amplification stages based on the power level of the input signal. The multistage variable gain amplifier system can output an output signal such that the amplification stages are controlled to adjust a gain applied to the input signal by the multistage variable gain amplifier system to output the output signal.

20 Claims, 6 Drawing Sheets

(51) Int. Cl.
*H03F 3/08* (2006.01)
*G01S 17/931* (2020.01)
*G01S 7/481* (2006.01)

(52) U.S. Cl.
CPC . *H03F 2200/129* (2013.01); *H03G 2201/103* (2013.01)

(58) Field of Classification Search
CPC .. H03G 3/3042; H03G 1/0023; G01S 7/4816; G01S 17/931; G01S 7/4868; G01S 7/4918; H03F 3/08; H03F 2200/129; H03F 2203/7236; H03F 3/72; H03F 1/0222; H03F 2200/102; H03F 3/68; H03F 3/211; H03F 3/602; H03F 3/195; H03F 1/0288
USPC .............................. 330/124 R, 136, 278, 295

See application file for complete search history.

(56) References Cited

U.S. PATENT DOCUMENTS

| | | | |
|---|---|---|---|
| 6,750,709 | B2 | 6/2004 | Raghaven et al. |
| 6,819,171 | B2* | 11/2004 | Kenington ............ H03F 1/0294 |
| | | | 330/51 |
| 6,873,208 | B2 | 3/2005 | Shinjo et al. |
| 6,927,628 | B2 | 8/2005 | Oshima et al. |
| 7,352,239 | B2* | 4/2008 | Lee ........................... H03F 3/72 |
| | | | 330/51 |
| 7,733,175 | B2 | 6/2010 | Lu et al. |
| 8,362,837 | B2 | 1/2013 | Koren et al. |
| 9,000,842 | B2 | 4/2015 | Aoki et al. |
| 9,602,060 | B2 | 3/2017 | Gorbachov et al. |
| 11,271,536 | B2 | 3/2022 | Benboudjema et al. |
| 2021/0336594 | A1 | 10/2021 | Benboudjema et al. |

OTHER PUBLICATIONS

"Office Action for U.S. Appl. No. 16/858,559", dated Nov. 24, 2021, 11 pages.
"Response to the Ofice Action for U.S. Appl. No. 16/858,559", filed Nov. 28, 2021, 13 pages.

* cited by examiner

MULTISTAGE VARIABLE GAIN AMPLIFIER FOR SENSOR APPLICATION

CROSS-REFERENCE TO RELATED APPLICATION

This application is a continuation of U.S. patent application Ser. No. 16/858,559, filed on Apr. 24, 2020, and entitled "MULTISTAGE VARIABLE GAIN AMPLIFIER FOR SENSOR APPLICATION", the entirety of which is incorporated herein by reference.

BACKGROUND

Autonomous vehicles are currently in development, where an autonomous vehicle includes various sensor systems that output sensor signals as well as a computing system that controls operation of the autonomous vehicle based upon the sensor signals outputted by the sensor systems. The sensor systems of the autonomous vehicle may include a lidar sensor system that is configured to generate a three-dimensional point cloud of surroundings of the autonomous vehicle. Points in the point cloud represent distances between the lidar sensor system and objects in a field of view of the lidar sensor system. The lidar sensor system includes a laser that emits an optical signal and a photodetector that detects a return signal, where the return signal is based upon the optical signal reflecting from an object. Based upon a parameter of the return signal, a distance between the lidar sensor system and the object as well as a velocity of the object relative to the lidar sensor system can be computed. The computing system of the autonomous vehicle can control operation of the autonomous vehicle based upon the computed range and velocity.

Conventional lidar sensor systems oftentimes include fixed gain amplifiers. A photodetector of a lidar sensor system can detect a return signal received at the lidar sensor system responsive to an optical signal reflected from an object in an environment nearby the lidar sensor system. The photodetector can output a signal (e.g., an electrical signal), which can be provided to a fixed gain amplifier. The fixed gain amplifier can apply a fixed gain regardless of a type of the object in the environment nearby the lidar sensor system that reflected the optical signal or a distance between the object and the lidar sensor system.

The return signal received at the lidar sensor system (and accordingly the electrical signal outputted by the photodetector), however, can have a signal level that depends on the type of the object and the distance. Thus, use of a conventional fixed gain amplifier operating in a fixed gain mode may lead to saturation of sub-block(s) of the receiver of the lidar sensor system or a detrimentally impacted ability to detect various object(s) within a field of view of the lidar sensor system that cause relatively weak return signals to be received by the lidar sensor system. Pursuant to an illustration, when the return signal is reflected by an object at a relatively short range from the lidar sensor system, a power level of the return signal may cause saturation of sub-blocks of the receiver of the lidar sensor system (or at least a subset of the sub-blocks of the receiver), which can detrimentally impact an ability of the lidar sensor system from detecting the object. According to another illustration, when the return signal is reflected by an object at a relatively long range from the lidar sensor system, a power level of the return signal may be low (e.g., the lidar sensor system may be unable to detect the object due to the return signal being too low, higher gain as compared to a gain applied by the fixed gain amplifier may be needed). Moreover, the type of the object may lead to the return signal having differing signal levels (e.g., a return signal reflected by a first object formed of a retroreflective material can be stronger than a return signal reflected by a second object formed of rubber where the first object and the second object are at the same distance from the lidar sensor system); thus, the type of the object may similarly lead to saturation or a signal level being too low when utilizing conventional fixed gain amplifiers.

SUMMARY

The following is a brief summary of subject matter that is described in greater detail herein. This summary is not intended to be limiting as to the scope of the claims.

Described herein are various technologies that pertain to variable gain amplification for a sensor application. A multistage variable gain amplifier system can provide variable gain amplification of an input signal. According to various embodiments, a lidar sensor system can include the multistage variable gain amplifier system. For example, the multistage variable gain amplifier system can be configured to receive an input signal from a photodetector of a lidar sensor system. Additionally or alternatively, the multistage variable gain amplifier system can be configured to output an output signal to an analog-to-digital converter of the lidar sensor system. However, it is contemplated that other components of the lidar sensor system can be electrically coupled between the photodetector and the multistage variable gain amplifier system and/or the multistage variable gain amplifier system and the analog-to-digital converter. According to an example, an autonomous vehicle can include a lidar sensor system that includes the multistage variable gain amplifier system.

The multistage variable gain amplifier system includes a plurality of amplification stages. For instance, the multistage variable gain amplifier system can include at least a first amplification stage and a second amplification stage. The multistage variable gain amplifier system further includes a power detector configured to detect a power level of an input signal received by the multistage variable gain amplifier system. The multistage variable gain amplifier system can also include a controller configured to control the amplification stages (e.g., the first amplification stage and the second amplification stage) based on the power level of the input signal. The multistage variable gain amplifier system can output an output signal such that the amplification stages (e.g., the first amplification stage and the second amplification stage) are controlled to adjust a gain applied to the input signal by the multistage variable gain amplifier system to output the output signal.

According to various embodiments, the first amplification stage and the second amplification stage (as well as other amplification stage(s) of the multistage variable gain amplifier system, if any) can be in series. The first amplification stage can include a first amplifier, a first switch, and a first attenuator. The first switch and the first attenuator can be in series. Moreover, the first amplifier can be in parallel with the first switch and the first attenuator. The first switch can be closed to bypass the first amplifier and the first switch can be opened to enable the first amplifier. The second amplification stage can include a second amplifier, a second switch, and a second attenuator. The second switch and the second attenuator can be in series. Further, the second amplifier can be in parallel with the second switch and the second attenuator. The second switch can be closed to bypass the second amplifier and the second switch can be opened to enable the second amplifier. As noted above, the power detector can be configured to detect the power level of the input signal received by the multistage variable gain amplifier system. The controller of the multistage variable gain amplifier system can include at least a first comparator and a second comparator. The first comparator can be configured to compare the power level of the input signal to a first threshold. The first comparator can output a first switch signal that sets a first state (e.g., opened or closed) of the first switch of the first amplification stage based on a comparison of the power level of the input signal to the first threshold. Moreover, the second comparator can be configured to compare the power level of the input signal to a second threshold. The second comparator can output a second switch signal that sets a second state (e.g., opened or closed) of the second switch of the second amplification stage based on a comparison of the power level of the input signal to the second threshold. Thus, the first amplification stage and the second amplification stage can apply an adjustable gain to the input signal (e.g., depending on whether the first amplifier and/or the second amplifier are enabled). Further, the multistage variable gain amplifier system can output the output signal based on the input signal.

According to various embodiments, it is contemplated that the multistage variable gain amplifier system can include an integrated circuit. The integrated circuit, for instance, can include the first amplification stage, the second amplification stage, other amplification stage(s) (if any), the power detector, and the controller. However, it is contemplated that the multistage variable gain amplifier system can additionally or alternatively include discrete components (e.g., a subset of the elements of the multistage variable gain amplifier system can be discrete components while an integrated circuit can include a remainder of the elements of the multistage variable gain amplifier system, the multistage variable gain amplifier system may lack an integrated circuit).

As noted above, in various embodiments, the amplification stages can each include a respective attenuator (e.g., the first amplification stage can include the first attenuator, the second amplification stage can include the second attenuator). When an amplifier of a given amplification stage is bypassed (e.g., a switch of the given amplification stage is closed), the signal can flow through an attenuator of the given amplification stage to attenuate the signal. According to various examples, attenuations caused by the attenuators can be fixed. Pursuant to other examples, attenuations caused by the attenuators can be variable. For instance, the controller of the multistage variable gain amplifier system can be configured to control, based on the power level of the input signal, a first attenuation of the first attenuator of the first amplification stage, a second attenuation of the second attenuator of the second amplification stage, and so forth.

Pursuant to other embodiments, the amplification stages can be in parallel. For instance, the multistage variable gain amplifier system can include a single pole, N throw switch. The controller of the multistage variable gain amplifier system can be configured to control the single pole, N throw switch to connect an input node at which the input signal is received to a particular amplification stage based on the power level of the input signal. For instance, the particular amplification stage can be selected from a set of N amplification stages that includes the first amplification stage and the second amplification stage.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
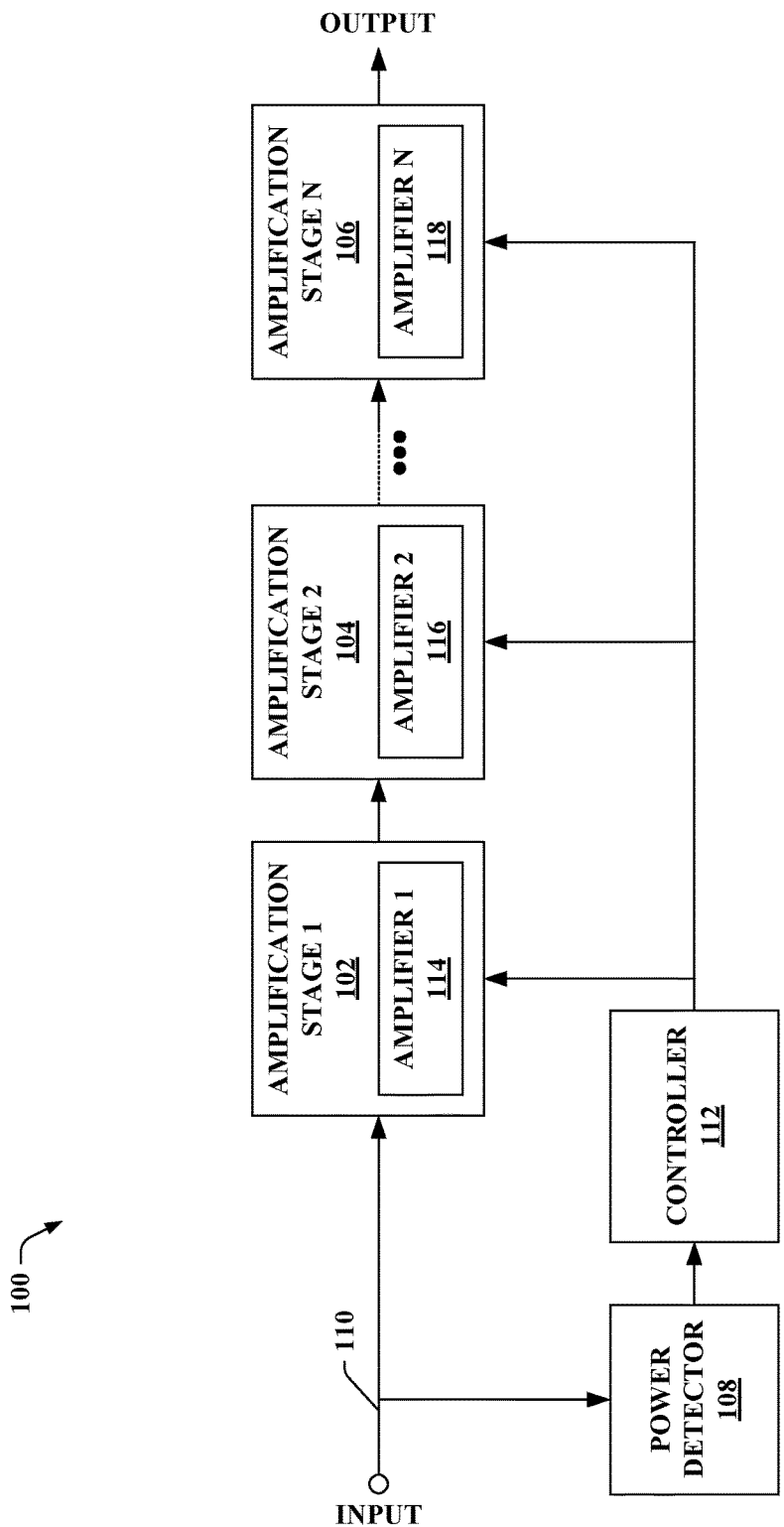
FIG. 1 illustrates a block diagram of an exemplary multistage variable gain amplifier system.

Various technologies pertaining to variable gain amplification using a multistage architecture for a sensor application are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the term "exemplary" is intended to mean "serving as an illustration or example of something."

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

As used herein, and unless the context dictates otherwise, the term "coupled to" is intended to include both direct coupling (in which two elements that are coupled to each other contact each other) and indirect coupling (in which at least one additional element is located between the two elements).

Referring now to the drawings, FIG. 1 illustrates an exemplary multistage variable gain amplifier system 100. The multistage variable gain amplifier system 100 includes a plurality of amplification stages; in particular, N amplification stages are included as part of the multistage variable gain amplifier system 100, where N can be any integer greater than 1. As depicted in many of the examples set forth herein, the multistage variable gain amplifier system 100 can include a first amplification stage 102, a second amplification stage 104, . . . and an Nth amplification stage 106 (collectively referred to herein as amplification stages 102-106). While at least three amplification stages 102-106 are depicted in many examples, it is contemplated that the multistage variable gain amplifier system 100 can include two amplification stages (e.g., the first amplification stage 102 and the Nth amplification stage 106). In the example shown in FIG. 1, the amplification stages 102-106 are in series (e.g., the first amplification stage 102 is coupled to the second amplification stage 104 such that an output of the first amplification stage 102 is inputted to the second amplification stage 104).

The multistage variable gain amplifier system 100 further includes a power detector 108 configured to detect a power level of an input signal received by the multistage variable gain amplifier system 100. The input signal can be received at an input node 110 of the multistage variable gain amplifier system 100. The power detector 108, for instance, can be a root mean square (RMS) detector. However, other types of power detectors are intended to fall within the scope of the hereto appended claims.

Moreover, the multistage variable gain amplifier system 100 includes a controller 112 configured to control the amplification stages 102-106 of the multistage variable gain amplifier system 100 based on the power level of the input signal. Thus, the controller 112 can control the first amplification stage 102, the second amplification stage 104, . . . , and the Nth amplification stage 106 based on the power level of the input signal detected by the power detector 108. The multistage variable gain amplifier system 100 can output an output signal such that the amplification stages 102-106 are controlled by the controller 112 to adjust a gain applied to the input signal by the multistage variable gain amplifier system 100 to output the output signal.

Each of the amplification stages 102-106 can include a corresponding amplifier. For instance, the first amplification stage 102 can include a first amplifier 114, the second amplification stage 104 can include a second amplifier 116, . . . , and the Nth amplification stage 106 can include an Nth amplifier 118. As noted above, the controller 112 can be configured to control the amplification stages 102-106 based on the power level of the input signal detected by the power detector 108. According to various embodiments, the controller 112 can be configured to compare the power level of the input signal to respective thresholds (e.g., respective threshold power levels) corresponding to the amplification stages 102-106; based on the comparisons, the controller 112 can be configured to bypass or enable the amplifiers 114-118. Thus, the controller 112 can control whether each of the amplifiers 114-118 are enabled or bypassed based on the power level of the input signal. For instance, for a given amplification stage (e.g., one of the amplification stages 102-106), the power level of the input signal can be compared to a corresponding threshold for the given amplification stage. If the power level of the input signal is above the threshold, then an amplifier of the given amplification stage can be bypassed (e.g., the signal can flow through the given amplification stage while bypassing the amplifier). Alternatively, if the power level of the input signal is equal to or below the threshold, then the amplifier of the given amplification stage can be enabled and the signal can flow through the amplifier operating in a linear region.

Pursuant to an illustration, the controller 112 can be configured to compare the power level of the input signal to a first threshold for the first amplification stage 102. The controller 112 can be configured to control the first amplification stage 102 such that the first amplifier 114 is bypassed when the power level of the input signal is above the first threshold and the first amplifier 114 is enabled when the power level is equal to or below the first threshold. Further, the controller 112 can be configured to compare the power level of the input signal to a second threshold for the second amplification stage 104. The controller 112 can be configured to control the second amplification stage 104 such that the second amplifier 116 is bypassed when the power level of the input signal is above the second threshold and the second amplifier 116 is enabled when the power level is equal to or below the second threshold. The controller 112 can similarly compare the power level of the input signal to threshold(s) corresponding to other amplification stage(s), and likewise control such amplification stage(s).

Incorporating the multistage variable gain amplifier system 100 in a receiver front-end of a sensor system (e.g., a lidar sensor system) can enable increasing a dynamic range of the receiver front-end relative to conventional receiver front-end architectures that include fixed gain amplifiers. The power detector 108 of the multistage variable gain amplifier system 100 can sense the power level of the input signal, and the controller 112 can adjust respective gains of the amplification stages 102-106 based on the power level of the input signal. Adjusting a gain of an amplification stage, for each of the amplification stages 102-106, can mitigate the output signal outputted by the multistage variable gain amplifier system 100 causing saturation of downstream component(s) (e.g., saturation of an analog-to-digital converter to which the output signal is provided can be mitigated). Further, the amplifier gain adjustment of the multistage variable gain amplifier system 100 controlled by the controller 112 can be based on a single cycle, which can lead to a relatively short gain adjustment response time (e.g., for the gain of the multistage variable gain amplifier system 100 to adjust due to a change in the power level of the input signal).

Pursuant to other embodiments, rather than enabling or bypassing the amplifiers 114-118, the controller 112 can be configured to control a respective gain of each of the amplifiers 114-118 based on the power level of the input signal detected by the power detector 108. Accordingly, the controller 112 can be configured to control a first gain of the first amplifier 114 of the first amplification stage 102 based on the power level of the input signal. The controller 112 can further be configured to control a second gain of the second amplifier 116 of the second amplification stage 104 based on the power level of the input signal. The controller 112 can also be configured to control gain(s) of other amplifiers of other amplification stages (if any) based on the power level of the input signal (e.g. an Nth gain of the Nth amplifier 118 of the Nth amplification stage 106 can be controlled based on the power level of the input signal).

Figure 2:
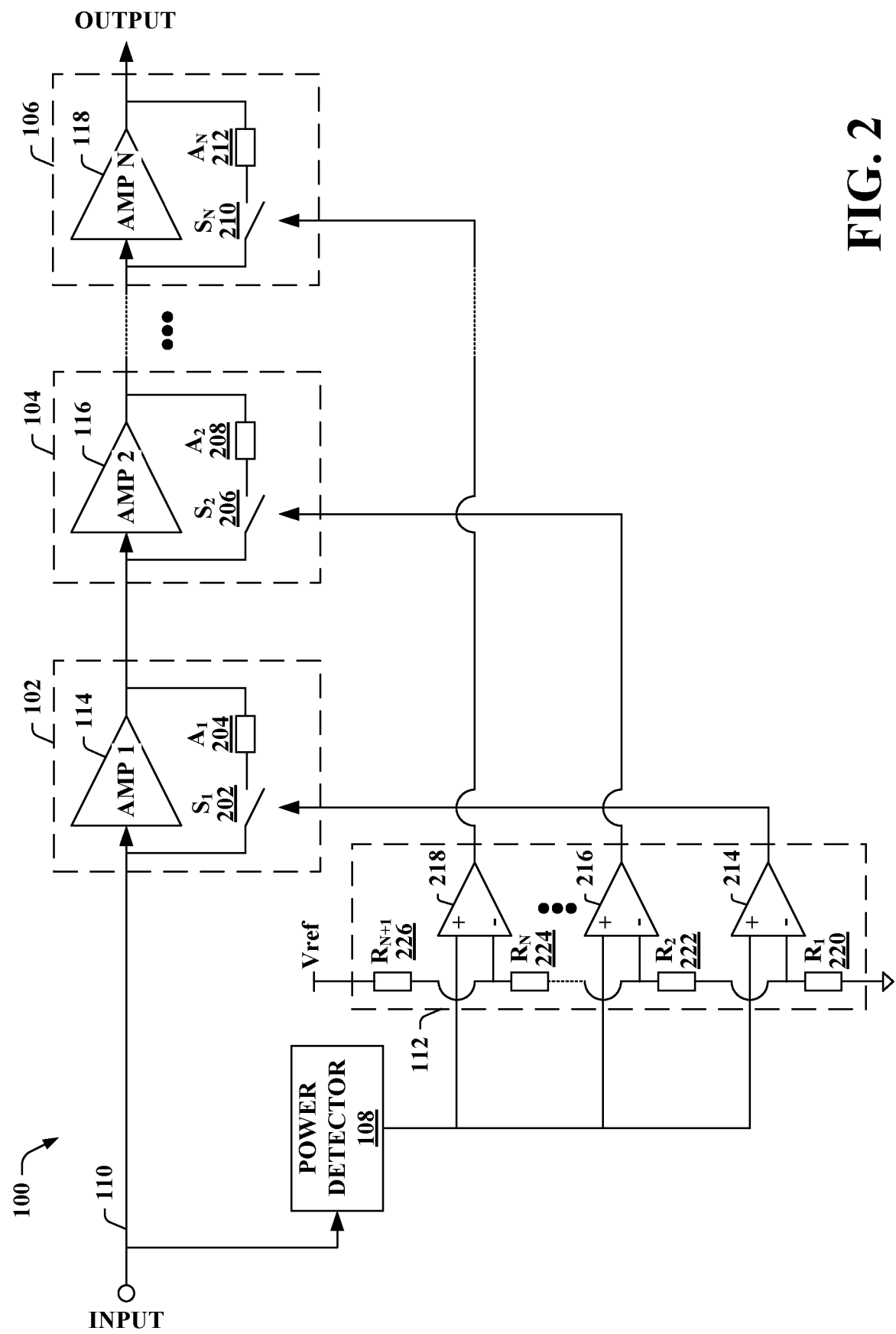
FIG. 2 illustrates an exemplary embodiment of the multistage variable gain amplifier system of FIG. 1.

Now turning to FIG. 2, illustrated is an exemplary embodiment of the multistage variable gain amplifier system 100 of FIG. 1. Again, the multistage variable gain amplifier system 100 includes the amplification stages 102-106, the power detector 108, and the controller 112. Moreover, the first amplification stage 102 includes the first amplifier 114, the second amplification stage 104 includes the second amplifier 116, . . . , and the Nth amplification stage 106 includes the Nth amplifier 118.

As depicted in FIG. 2, each of the amplification stages 102-106 can also include a switch and an attenuator. In particular, the first amplification stage 102 can include a first switch ($S_1$) 202 and a first attenuator ($A_1$) 206. The second amplification stage 104 can include a second switch ($S_2$) 206 and a second attenuator ($A_2$) 208. Moreover, the Nth amplification stage 106 can include an Nth switch ($S_N$) 210 and an Nth attenuator ($A_N$) 212.

The switches and attenuators allow for the amplifiers 114-118 of the amplification stages 102-106 to be selectively bypassed. For instance, in the first amplification stage 102, the first switch 202 and the first attenuator 204 can be in series. The first amplifier 114 can be in parallel with the first switch 202 and the first attenuator 204. Similarly, in the second amplification stage 104, the second switch 206 and the second attenuator 208 can be in series. The second amplifier 116 can be in parallel with the second switch 206 and the second attenuator 208. Likewise, in the Nth amplification stage 106, the Nth switch 210 and the Nth attenuator 212 can be in series. The Nth amplifier 118 can be in parallel with the Nth switch 210 and the Nth attenuator 212.

In the first amplification stage 102, the first switch 202 can be closed to bypass first amplifier 114. Alternatively, the first switch 202 can be opened to enable the first amplifier 114. When the first switch 202 is closed, the signal flowing from the input node 110 to the second amplification stage 104 can be attenuated by the first attenuator 204 rather than passing through the first amplifier 114. When the first switch 202 is opened, the signal flowing from the input node 110 to the second amplification stage 104 can pass through the first amplifier 114 operating in a linear region; accordingly, the first amplifier 114 can amplify the signal when the first switch 202 is opened.

Similarly, in the second amplification stage 104, the second switch 206 can be closed to bypass the second amplifier 116 or can be opened to enable the second amplifier 116. Accordingly, when the second switch 206 is closed, the signal flowing through the second amplification stage 104 (e.g., from the first amplification stage 102 to the Nth amplification stage 106) can be attenuated by the second attenuator 208 rather than passing through the second amplifier 116. Alternatively, when the second switch 206 is opened, the signal flowing through the second amplification stage 104 can pass through the second amplifier 116 operating in a linear region, and thus, the second amplifier 116 can amplify the signal when the second switch 206 is opened. The other amplification stages (e.g., the Nth amplification stage 106) (if any) can similarly operate.

As set forth herein, the power detector 108 can detect a power level of an input signal received by the multistage variable gain amplifier system 100 at the input node 110. For example, the power detector 108 can be an RMS detector; yet, other types of power detectors are intended to fall within the scope of the hereto appended claims. Moreover, the controller 112 can control the amplification stages 102-106 based on the power level of the input signal detected by the power detector 108. For instance, the controller 112 can control whether the switches 202, 206, . . . , and 210 are opened or closed to control the amplification stages 102-106.

In the example shown in FIG. 2, the controller 112 includes N comparators. In particular, the controller 112 can include a first comparator 214, a second comparator 216, . . . , and an Nth comparator 218. The first comparator 214 can be configured to compare the power level of the input signal to a first threshold for the first amplification stage 102. The first comparator 214 can output a first switch signal that sets a first state of the first switch 202 (e.g., the first state is one of opened or closed) based on the comparison of the power level of the input signal to the first threshold. Moreover, the second comparator 216 can be configured to compare the power level of the input signal to a second threshold for the second amplification stage 104. The second comparator 216 can output a second switch signal that sets a second state of the second switch 206 (e.g., the second state is one of opened or closed) based on the comparison of the power level of the input signal to the second threshold. Similarly, the other comparators of the controller 112 can compare the power level of the input signal to corresponding thresholds (e.g., the Nth comparator 218 can compare the power level of the input signal to an Nth threshold for the Nth amplification stage 106 such that the Nth comparator 218 can output an Nth switch signal that sets an Nth state of the Nth switch 210 based on the comparison of the power level of the input signal to the Nth threshold).

It is contemplated that the thresholds for the amplification stages 102-106 can be fixed in various embodiments. In other embodiments, it is to be appreciated that the thresholds can be modifiable. Pursuant to various examples, the controller 112 can include a voltage divider, which can set the thresholds. Accordingly, the thresholds for the amplification stages 102-106 can be based on resistances of a first resistor ($R_1$) 220, a second resistor ($R_2$) 222, . . . , an Nth resistor ($R_N$) 224, and an N+1th resistor ($R_{N+1}$) 226 included as part of the voltage divider of the controller 112. The resistances of the resistors 220-226 can be fixed, for instance. However, it is to be appreciated that the resistances of one or more of the resistors 220-226 can be modifiable, which can change a relationship between the thresholds. Moreover, the thresholds for the amplification stages 102-106 can be based on a reference voltage (Vref) applied to the voltage divider. Vref can be fixed in some embodiments. Yet, in other embodiments, the reference voltage can be adjusted based on an expected input signal power level range. According to an illustration, Vref can be changed based on a range of a lidar sensor system that includes the multistage variable gain amplifier system 100 (e.g., a higher voltage can be applied to provide a larger dynamic range for the lidar sensor system detecting objects from 0 to 200 meters versus the lidar sensor system detecting objects from 0 to 100 meters).

The attenuators 204, 208, . . . , and 212 of the amplification stages 102-106 attenuate the signal passing through such amplification stages 102-106 when the corresponding switches 202, 206, . . . , and 210 are closed. Thus, when an amplifier of a given amplification stage is bypassed (e.g., a switch of the given amplification stage is closed), the signal can flow through an attenuator of the given amplification stage to attenuate the signal. The attenuator of the given amplification stage can attenuate the signal to mitigate saturation of an amplifier of a different amplification stage. For instance, the signal can be attenuated by the first attenuator 204 of the first amplification stage 102 when the first switch 202 is closed so that the signal does not saturate the second amplifier 116 of the second amplification stage 104 when the second switch 206 is opened.

Various attenuator types are intended to fall within the scope of the hereto appended claims. For instance, the attenuators 204, 208, . . . , and 212 can include resistors, capacitors, resistive ladder networks, capacitive ladder networks, a combination thereof, and so forth.

According to various examples, attenuations caused by the attenuators 204, 208, . . . , and 212 can be fixed. Pursuant to an illustration, an attenuator (e.g., one of the attenuators 204, 208, . . . , or 212) can reduce a signal strength of a signal passing there through by X dB, where X is a fixed real number (e.g., 6 dB).

Pursuant to other examples, attenuations caused by the attenuators 204, 208, . . . , and 212 can be variable. For instance, the controller 112 of the multistage variable gain amplifier system 100 can be configured to control, based on the power level of the input signal, a first attenuation of the first attenuator 204 of the first amplification stage 102, a second attenuation of the second attenuator 208 of the second amplification stage 104, . . . , and an Nth attenuation of the Nth attenuator 212 of the Nth amplification stage 212. The controller 112 can control the attenuation(s) of the attenuator(s) 204, 208, . . . , and 212 to protect a first amplifier that is not bypassed in the multistage variable gain amplifier system 100.

Figure 3:
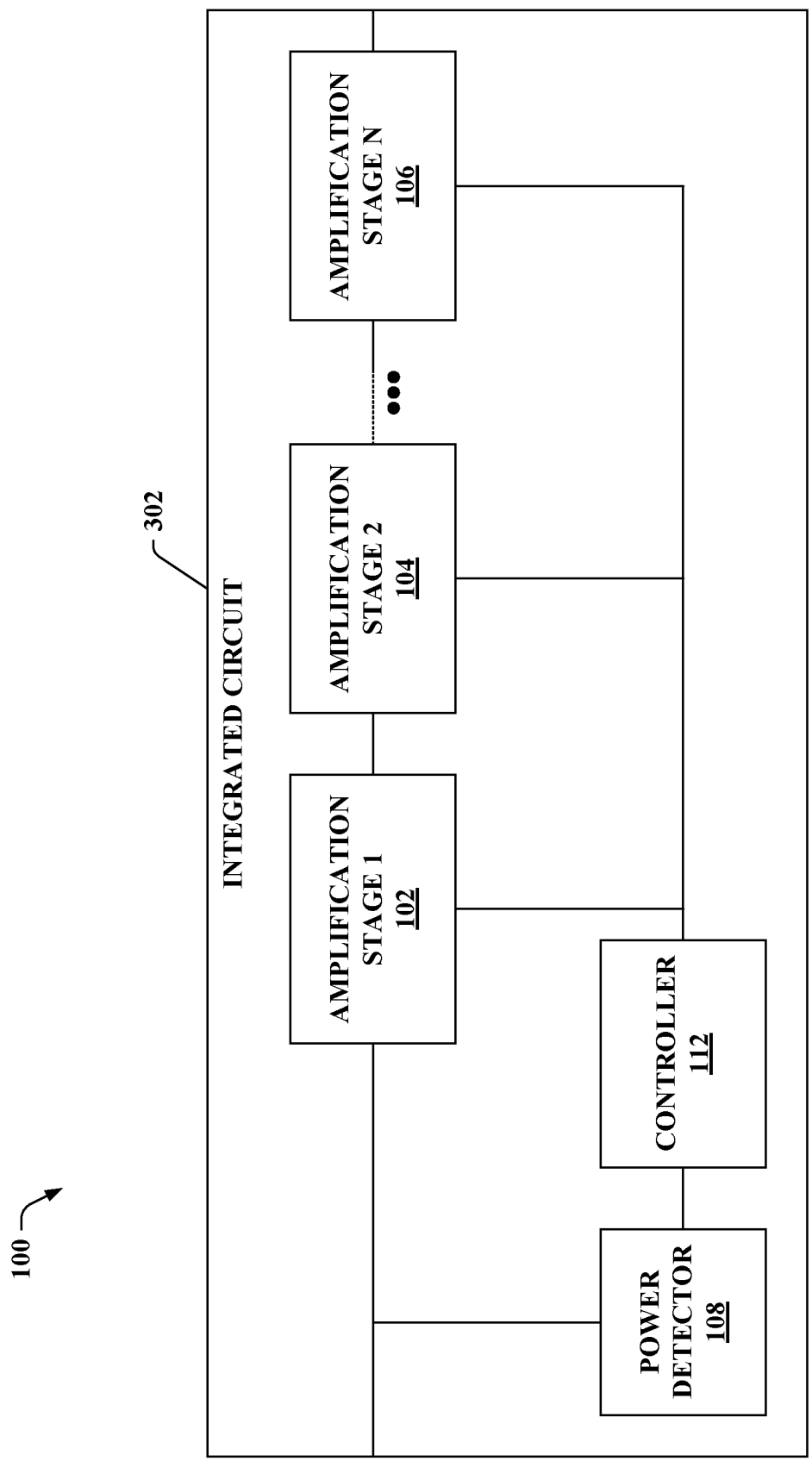
FIG. 3 illustrates another exemplary embodiment of the multistage variable gain amplifier system of FIG. 1.

According to various embodiments, it is contemplated that the multistage variable gain amplifier system 100 can include discrete components. Additionally or alternatively, the multistage variable gain amplifier system 100 can include an integrated circuit. Now turning to FIG. 3, illustrated is another exemplary embodiment of the multistage variable gain amplifier system 100. As shown in FIG. 3, the multistage variable gain amplifier system 100 includes an integrated circuit 302 (e.g., an application-specific integrated circuit (ASIC)). The integrated circuit 302 includes the amplification stages 102-106, the power detector 108, and the controller 112.

While FIG. 3 depicts the integrated circuit 302 including the amplification stages 102-106, the power detector 108, and the controller 112, it is to be appreciated that some of the elements can alternatively be discrete components. For instance, the integrated circuit 302 can include the power detector 108 and the controller 112, while the amplification stages 102-106 can be discrete components. According to another example, the multistage variable gain amplifier system 100 can include more than one integrated circuit (e.g., a first integrated circuit can include the amplification stages 102-106 and a second integrated circuit coupled to the first integrated circuit can include the power detector 108 and the controller 112).

Figure 4:
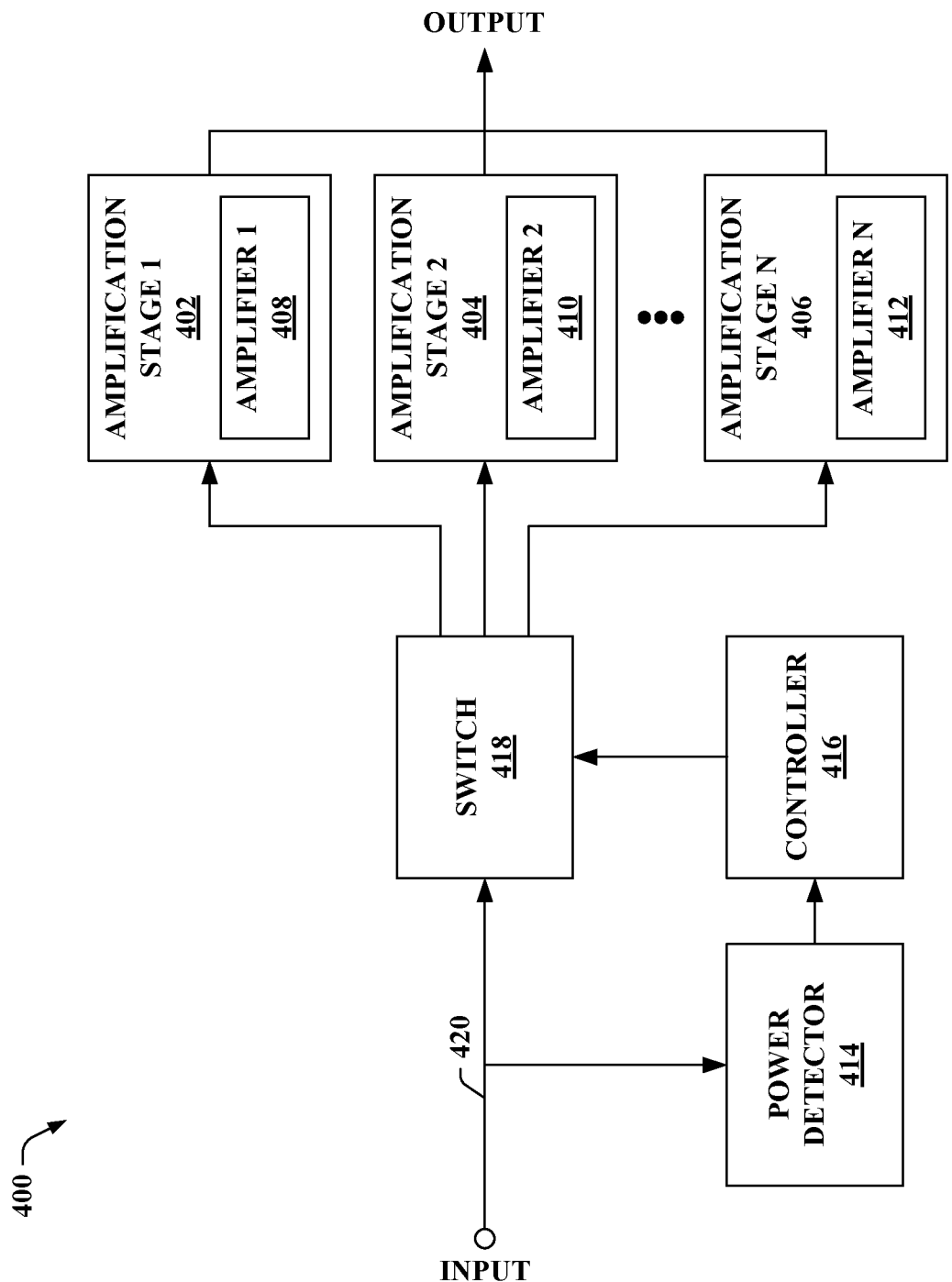
FIG. 4 illustrates a block diagram of another exemplary multistage variable gain amplifier system.

With reference to FIG. 4, illustrated is another exemplary multistage variable gain amplifier system 400. The multistage variable gain amplifier system 400 again includes a plurality of amplification stages, namely, a first amplification stage 402, a second amplification stage 404, . . . , and an Nth amplification stage 406 (collectively referred to herein as amplification stages 402-406). While at least three amplification stages 402-406 are shown in FIG. 4, it is contemplated that the multistage variable gain amplifier system 400 can include two amplification stages. Further, as depicted in FIG. 4, the amplification stages 402-406 of the multistage variable gain amplifier system 400 are in parallel.

Similar to the amplification stages 102-106 described herein, the amplification stages 402-406 each include a respective amplifier. For instance, the first amplification stage 402 can include a first amplifier 408, the second amplification stage 404 can include a second amplifier 410, . . . , and the Nth amplification stage 406 can include an Nth amplifier 412. It is contemplated that gains of the amplifiers 408-412 can differ (e.g., a gain of the first amplifier 408 can be greater than a gain of the second amplifier 410, the gain of the second amplifier 410 can be greater than a gain of the Nth amplifier 412).

The multistage variable gain amplifier system 400 further includes a power detector 414, a controller 416, and a switch 418. The power detector 414 can be similar to the power detector 108 (e.g., the power detector 414 can be an RMS detector). The power detector 414 can detect a power level of an input signal received at an input node 420 of the multistage variable gain amplifier system 400. Moreover, the controller 416 can control the amplification stages 402-406 based on the power level of the input signal detected by the power detector 414.

The switch 418 can be a single pole, N throw switch. Accordingly, the controller 416 can be configured to control the single pole, N throw switch 418 to connect the input node 420 to a particular amplification stage from the amplification stages 402-406 based on the power level of the input signal. Accordingly, the particular amplification stage connected to the input node 420 via the single pole, N throw switch 418 can be selected by the controller 416 based on the power level of the input signal and a gain to be applied to the input signal (where such gain is provided by the amplifier of the particular amplification stage).

Similar to above with respect to the multistage variable gain amplifier system 100, it is contemplated that the multistage variable gain amplifier system 400 can include discrete components and/or an integrated circuit.

Moreover, according to various embodiments, it is contemplated that one or more of the amplification stages 402-406 can include an attenuator in series with the amplifier. According to an illustration, the first amplification stage 402 can include an attenuator in series with the first amplifier 408 (e.g., the input signal can pass through the attenuator and can then pass through the first amplifier 408). Following this illustration, when the first amplification stage 402 is connected to the input node 420 by the switch 418, the attenuator can attenuate a signal flowing through the attenuator and the first amplifier 408 to mitigate saturation of the first amplifier 408. It is to be appreciated that the attenuation of the attenuator can be fixed or adjustable (e.g., adjustable attenuation can be controlled by the controller 416). Moreover, attenuators of different amplification stages 402-406 can provide differing attenuations. Thus, it is contemplated that the controller 416 can further control the switch 418 to select a particular amplification stage from the amplification stages 402-406 based on the attenuation (if any) in addition to the power level of the input signal and the gain to be applied to the input signal. However, in other embodiments, the amplification stages 402-406 may lack attenuators.

Figure 5:
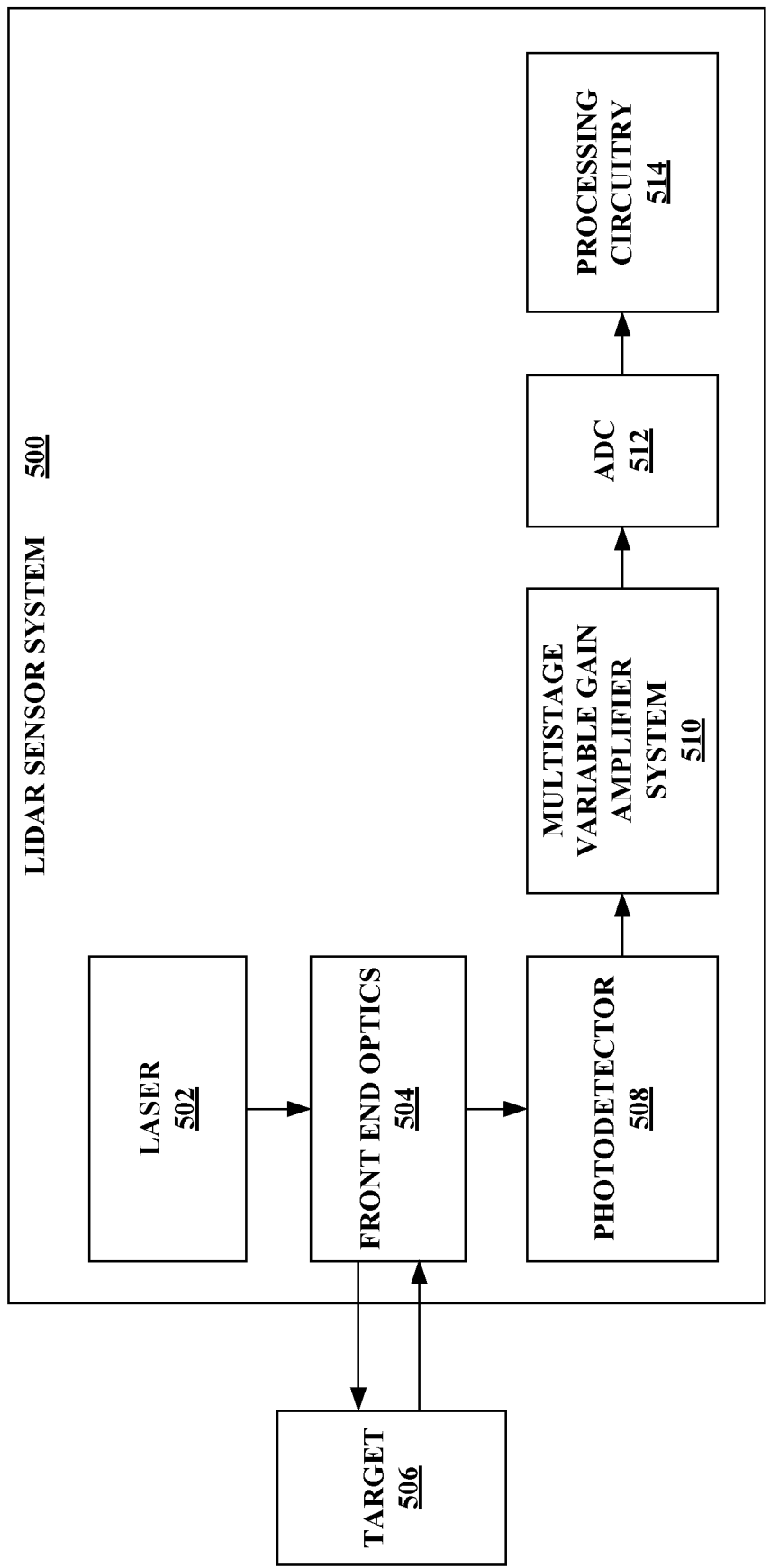
FIG. 5 illustrates a block diagram of an exemplary lidar sensor system that includes a multistage variable gain amplifier system.

With reference to FIG. 5, illustrated is an exemplary lidar sensor system 500. The lidar sensor system 500 can be a frequency modulated continuous wave (FMCW) lidar sensor system or a time of flight (TOF) lidar sensor system; however, the claimed subject matter is not so limited. According to an example, an autonomous vehicle can include the lidar sensor system 500. However, it is to be appreciated that the claimed subject matter is not so limited.

The lidar sensor system 500 includes a laser 502 that emits an optical signal. For instance, the optical signal can be frequency modulated to include an optical frequency chirp. The lidar sensor system 500 further includes front end optics 504 configured to transmit, into an environment of the lidar sensor system 500, at least a portion of the optical signal emitted by the laser 502. According to various examples, the front end optics 504 can include a scanner, which can direct the optical signal over a field of view in the environment. The front end optics 504 can also include other optical elements, such as one or more lenses, an optical isolator, one or more waveguides, an optical amplifier, and so forth. Such optical elements can enable generating the optical signal with desired properties such as collimation, divergence angle, linewidth, power, and the like. Such optical elements may be assembled discretely, or integrated on a chip, or in a combination of both. The front end optics 504 can also be configured to receive a reflected optical signal from the environment. The reflected optical signal can correspond to at least a part of the optical signal transmitted into the environment that reflected off a target 506 in the environment.

Moreover, the lidar sensor system 500 can include a photodetector 508, a multistage variable gain amplifier system 510, an analog to digital converter (ADC) 512, and processing circuitry 514. The photodetector 508 can be configured to convert the reflected optical signal received by the front end optics 504 to an electrical signal. The signal outputted by the photodetector 508 (e.g., an input signal) can be inputted to the multistage variable gain amplifier system 510 (e.g., the multistage variable gain amplifier system 100, the multistage variable gain amplifier system 400), which can apply an adjustable gain to the input signal to generate an output signal as described herein. The output signal from the multistage variable gain amplifier system 510 can be outputted to the analog to digital converter 512. Moreover, the processing circuitry 514 can be configured to compute distance and velocity data of the target 506 in the environment based on the output of the analog to digital converter 512.

The multistage variable gain amplifier system 510 provides a low noise amplification and filtering stage in the lidar sensor system 500 before the signal is provided to the digital signal processing elements (e.g., the analog to digital converter 512 and the processing circuitry 514). As described herein, the multistage variable gain amplifier system 510 can adjust the gain based on the input signal level received at the multistage variable gain amplifier system 510. Thus, use of the multistage variable gain amplifier system 510 enables detection of high and low reflectivity targets (e.g., the target 506) for short and long ranges. For instance, input power levels of input signals received at the multistage variable gain amplifier system 500 may change on the order of 100 dB; however, a dynamic range of the analog to digital converter 512 may be between 35-50 dB. Use of the multistage variable gain amplifier system 500 allows for the lidar sensor system 500 to detect targets that reflect signals having input power levels over a larger dynamic range (corresponding to the high and low reflectivity targets at short and long ranges).

Figure 6:
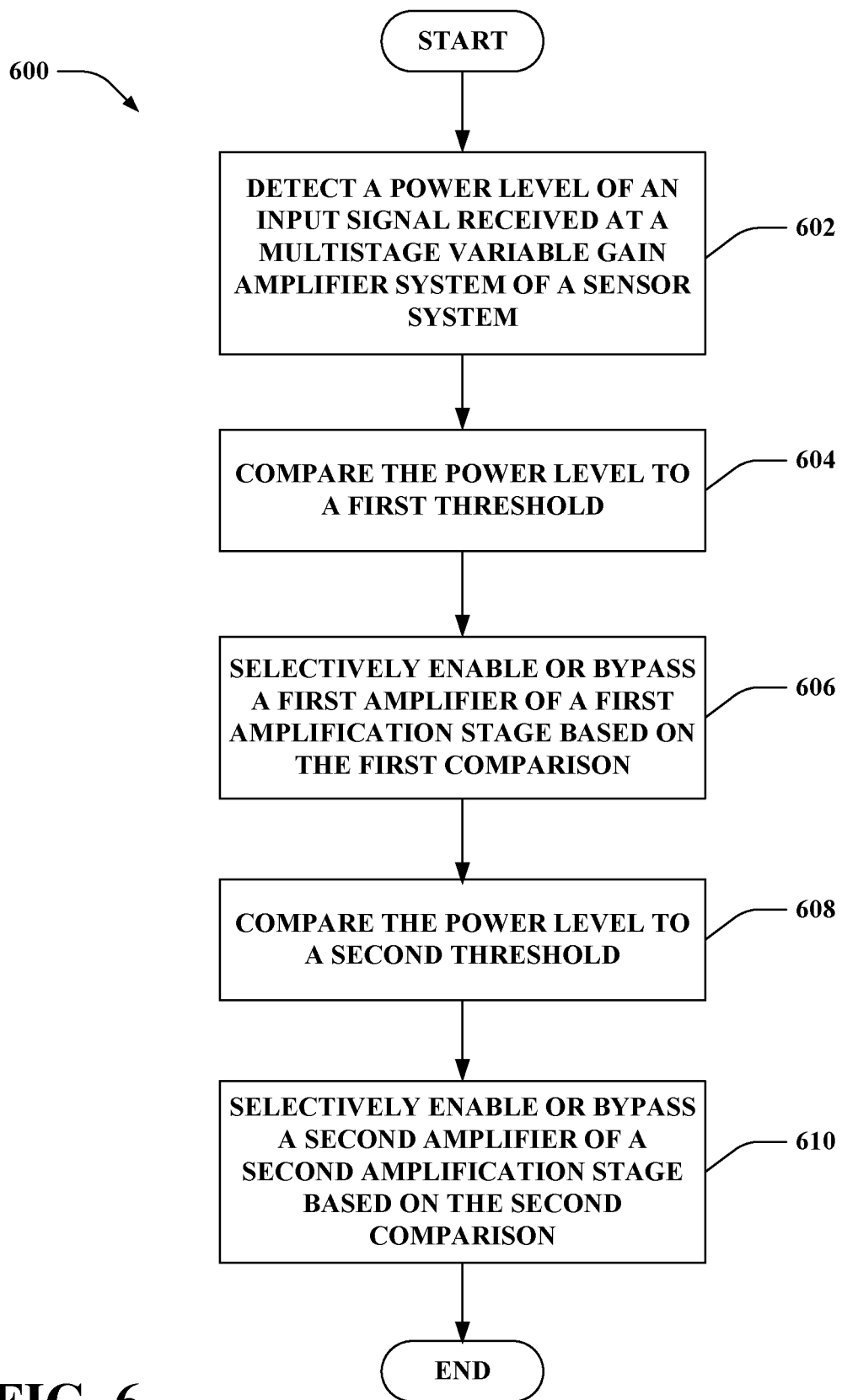
FIG. 6 is a flow diagram that illustrates an exemplary methodology of controlling amplification of a multistage variable gain amplifier system of a sensor system.

FIG. 6 illustrates an exemplary methodology related to controlling amplification of a multistage variable gain amplifier system of a sensor system. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

FIG. 6 illustrates a methodology 600 of controlling amplification of a multistage variable gain amplifier system of a sensor system. At 602, a power level of an input signal received at the multistage variable gain amplifier system of the sensor system can be detected. The multistage variable gain amplifier system, for instance, can be included as part of a lidar sensor system. According to an illustration, an autonomous vehicle can include the sensor system; yet, the claimed subject matter is not so limited. At 604, the power level of the input signal can be compared to a first threshold. At 606, a first amplifier of a first amplification stage of the multistage variable gain amplifier system can be selectively enabled or bypassed based on the comparison of the power level of the input signal to the first threshold. At 608, the power level of the input signal can be compared to a second threshold. At 610, a second amplifier of a second amplification stage of the multistage variable gain amplifier system can be selectively enabled or bypassed based on the comparison of the power level of the input signal to the second threshold. For instance, the first amplification stage and the second amplification stage can be in series; thus, the input signal can flow through the first amplification stage and the second amplification.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:
1. A multistage variable gain amplifier system, comprising:
   an input node configured to receive an input signal;
   a set of N amplification stages, wherein N is an integer greater than 1, the set of N amplification stages comprises at least:
      a first amplification stage; and
      a second amplification stage;
   a power detector configured to detect a power level of the input signal received by the multistage variable gain amplifier system at the input node;
   a single pole, N throw switch; and
   a controller configured to control the single pole, N throw switch to connect the input node at which the input signal is received to a particular amplification stage based on the power level of the input signal, the particular amplification stage being selected from the set of N amplification stages;
   wherein the multistage variable gain amplifier system outputs an output signal such that a gain applied to the input signal by the multistage variable gain amplifier system is controlled to output the output signal; and
   wherein the gain applied to the input signal to generate the output signal outputted by the multistage variable gain amplifier system is particular gain of the particular amplification stage selected from the set of N amplification stages.

2. The multistage variable gain amplifier system of claim 1, wherein the first amplification stage and the second amplification stage are in parallel.

3. The multistage variable gain amplifier system of claim 1, further comprising:
an integrated circuit, wherein the integrated circuit comprises the first amplification stage, the second amplification stage, the power detector, the single pole, N throw switch, and the controller.

4. The multistage variable gain amplifier system of claim 1, wherein:
the first amplification stage comprises a first amplifier; and
the second amplification stage comprises a second amplifier.

5. The multistage variable gain amplifier system of claim 4, wherein a first gain of the first amplifier differs from a second gain of the second amplifier.

6. The multistage variable gain amplifier system of claim 4, wherein:
the first amplification stage further comprises a first attenuator, the first attenuator being in series with the first amplifier; and
the second amplification stage further comprises a second attenuator, the second attenuator being in series with the second amplifier.

7. The multistage variable gain amplifier system of claim 6, wherein a first attenuation of the first attenuator differs from a second attenuation of the second attenuator.

8. The multistage variable gain amplifier system of claim 6, wherein the controller is further configured to control at least one of the first attenuation of the first attenuator or the second attenuation of the second attenuator based on the power level of the input signal.

9. The multistage variable gain amplifier system of claim 1 configured to receive the input signal from a photodetector of a lidar sensor system.

10. The multistage variable gain amplifier system of claim 1 configured to output the output signal to an analog to digital converter of a lidar sensor system.

11. The multistage variable gain amplifier system of claim 1, wherein the power detector is a root mean square (RMS) detector.

12. The multistage variable gain amplifier system of claim 1 being included in a lidar sensor system of an autonomous vehicle.

13. A lidar sensor system, comprising:
a photodetector configured to convert an optical signal to an input electrical signal;
a multistage variable gain amplifier system configured to receive the input electrical signal, the multistage variable gain amplifier system comprising:
a set of N amplification stages, wherein N is an integer greater than 1, the set of N amplification stages comprises at least:
a first amplification stage; and
a second amplification stage;
a power detector configured to detect a power level of the input electrical signal received by the multistage variable gain amplifier system;
a single pole, N throw switch; and
a controller configured to control the single pole, N throw switch to connect an input node at which the input electrical signal is received to a particular amplification stage based on the power level of the input electrical signal, the particular amplification stage being selected from the set of N amplification stages;
wherein the multistage variable gain amplifier system outputs an output electrical signal such that a gain applied to the input electrical signal by the multistage variable gain amplifier system is controlled to output the output electrical signal; and
an analog to digital converter configured to convert the output electrical signal to a digital signal.

14. The lidar sensor system of claim 13, further comprising:
processing circuitry configured to compute distance and velocity data of a target in an environment based on the digital signal outputted by the analog to digital converter.

15. The lidar sensor system of claim 13, wherein:
the first amplification stage comprises a first amplifier;
the second amplification stage comprises a second amplifier; and
a first gain of the first amplifier differs from a second gain of the second amplifier.

16. The lidar sensor system of claim 13, wherein:
the first amplification stage comprises a first amplifier and a first attenuator, the first attenuator being in series with the first amplifier;
the second amplification stage comprises a second amplifier and a second attenuator, the second attenuator being in series with the second amplifier; and
a first attenuation of the first attenuator differs from a second attenuation of the second attenuator.

17. The lidar sesnor system of claim 13, the multistage variable gain amplifier system further comprising:
an integrated circuit, wherein the integrated circuit comprises the first amplification stage, the second amplification stage, the power detector, the single pole, N throw switch, and the controller.

18. The lidar sensor system of claim 13 being included in an autonomous vehicle.

19. A method of controlling amplification of a multistage variable gain amplifier system of a sensor system, comprising:
detecting a power level of an input signal received at an input node of the multistage variable gain amplifier system of the sensor system;
controlling a single pole, N throw switch of the multistage variable gain amplifier system to connect the input node at which the input signal is received to a particular amplification stage of the multistage variable gain amplifier system, the single pole, N throw switch being controlled based on the power level of the input signal, the particular amplification stage being selected from a set of amplification stages of the multistage variable gain amplifier system, the particular amplification stage outputs an output signal, wherein N is an integer greater than 1; and
outputting the output signal from the multistage variable gain amplifier system.

20. The method of claim 19, further comprising:
converting the output signal from the particular amplification stage outputted by the multistage variable gain amplifier system to a digital signal.

* * * * *